United States Patent [19]
Irvine et al.

[11] Patent Number: 6,063,186
[45] Date of Patent: May 16, 2000

[54] GROWTH OF VERY UNIFORM SILICON CARBIDE EPITAXIAL LAYERS

[75] Inventors: Kenneth George Irvine, Apex; Michael James Paisley, Garner; Olle Claes Erik Kordina, Durham, all of N.C.

[73] Assignee: Cree, Inc., Durham, N.C.

[21] Appl. No.: 08/992,157

[22] Filed: Dec. 17, 1997

[51] Int. Cl.$^7$ .................................................. C30B 25/14
[52] U.S. Cl. .............................. 117/89; 117/84; 117/93; 117/102; 427/248.1; 427/249; 427/255.1
[58] Field of Search ................................ 117/84, 89, 93, 117/94, 95, 98, 102, 105, 106; 427/248.1, 249, 255.1; 438/507

[56] References Cited

U.S. PATENT DOCUMENTS

| | | | |
|---|---|---|---|
| 4,912,063 | 3/1990 | Davis et al. | 117/97 |
| 4,912,064 | 3/1990 | Kong et al. | 438/507 |
| 5,200,022 | 4/1993 | Kong et al. | 117/95 |
| 5,674,320 | 10/1997 | Kordina et al. | |

FOREIGN PATENT DOCUMENTS

| | | |
|---|---|---|
| OS 4432813 | 3/1996 | Germany. |
| 61186288 | 8/1986 | Japan. |
| 02296799 | 12/1990 | Japan. |
| 2-296799 | 12/1990 | Japan. |
| WO96/23912 A1 | 8/1996 | WIPO. |
| WO 97/01658 A1 | 1/1997 | WIPO. |
| WO 97/13011 A1 | 4/1997 | WIPO. |
| WO 97/13012 A1 | 4/1997 | WIPO. |
| WO 97/13013 A1 | 4/1997 | WIPO. |
| WO 97/31133 A1 | 8/1997 | WIPO. |
| WO 97/31134 A1 | 8/1997 | WIPO. |

OTHER PUBLICATIONS

"Process Analysis of AP–CVD of Silicon Carbide", Rottner, K. et al., (Inst. of Appl. Phys; Mater. Res. Soc, 1994 p. 387–92 (Abstract only).

"One–Dimensional Fluid Mechanics/Kinetics Modeling of the CVD of SiC in a Vertical Reactor", Aluko, M.E., et al; Dept. of Chem Eng., Howard Univ., Washington; 1989. p. 42 of x+232 pp (Abstract only), 1988.

Kordina et al., High Temperature Chemical Vapor Deposition of SiC, Appl. Phys. Lett (69) 10, pp. 1456–1458, Sep. 2, 1996.

Kordina et al.; Growth of SiC by "Hot–Wall" CVD and HTCVD, Phys. Stat. Sol. (b) 202, 321–334 (1997).

M.I. Chaudhry et al., "The Role of Carrier Gases in the Epitaxial Growth of Beta–SiC on Si by CVD," Journal Of Crystal Growth, Vol. 113, N. 1/02, Aug. 1, 1991, pp. 120–126.

W. Von Muench et al., "New Susceptor Arrangement for the Epitaxial Growth of Beta–SiC on Silicon," Journal of Crystal Growth, Vol. 158, No. 4, Feb. 1, 1996, pp. 491–496.

J. D. Parsons et al., "Morphological Structure of Silicon Carbide, Chemically Vapor Deposited on Titanium Carbide, Using Ethylene, Carbon Tetrachloride, and Silicon Tetrachloride," Journal of the Electrochemical Society, Vol. 141, No. 3, Mar. 1, 1994, pp. 771–777.

N. Nordell et al., "Growth of SiC Using Hexamethyldisilane in a Hydrogen–Poor Ambient," Applied Physics Letters, Vol. 64, No. 13, Mar. 28, 1994, pp. 1647–1649.

*Primary Examiner*—Felisa Hitoshew
*Attorney, Agent, or Firm*—Philip Summa, P.A.

[57] ABSTRACT

An improved chemical vapor deposition method is disclosed that increases the uniformity of silicon carbide epitaxial layers and that is particularly useful for obtaining thicker epitaxial layers. The method comprises heating a reactor to a temperature at which silicon carbide source gases will form an epitaxial layer of silicon carbide on a substrate in the reactor; and then directing a flow of source and carrier gases through the heated reactor to form an epitaxial layer of silicon carbide on the substrate with the carrier gases comprising a blend of hydrogen and a second gas in which the second gas has a thermal conductivity that is less than the thermal conductivity of hydrogen so that the source gases deplete less as they pass through the reactor than they would if hydrogen is used as the sole carrier gas.

27 Claims, 6 Drawing Sheets

GROWTH OF VERY UNIFORM SILICON CARBIDE EPITAXIAL LAYERS

FIELD OF THE INVENTION

The present invention relates to the epitaxial growth of silicon carbide, and in particular relates to a method of chemical vapor deposition that produces very uniform epitaxial layers of silicon carbide on appropriate substrates.

BACKGROUND OF THE INVENTION

The present invention relates to the growth of silicon carbide epitaxial layers. As a semiconductor material, silicon carbide is particularly superior for high power, high frequency, and high temperature electronic devices. Silicon carbide has an extremely high thermal conductivity, and can withstand both high electric fields and high current densities before breakdown. Silicon carbide's wide band gap results in low leakage currents even at high temperatures. For these and other reasons, silicon carbide is a quite desirable semiconductor material for power devices; i.e., those designed to operate at relatively high voltages.

Silicon carbide is, however, a difficult material to work with. Growth processes must be carried out at relatively high temperatures, above at least about 1500° C. for epitaxial growth and approximately 2200° C. for sublimation growth. Additionally, silicon carbide can form over 150 polytypes, many of which are separated by small thermodynamic differences. As a result, single crystal growth of silicon carbide, either by epitaxial layer or bulk crystal, is a challenging process. Finally, silicon carbide's extreme hardness (it is most often industrially used as an abrasive material) contributes to the difficulty in handling it and forming it into appropriate semiconductor devices.

Nevertheless, over the last decade much progress has been made in growth techniques for silicon carbide and are reflected, for example, in U.S. Pat. Nos. 4,912,063; 4,912,064; Re. Pat. No. 34,861; U.S. Pat. Nos. 4,981,551; 5,200,022; and 5,459,107; all of which are either assigned, or exclusively licensed, to the assignee of the present invention. These and other patents that are commonly assigned with the present invention have sparked worldwide interest in growth techniques for silicon carbide and thereafter the production of appropriate semiconductor devices from silicon carbide.

One particular growth technique is referred to as "chemical vapor deposition" or "CVD." In this technique, source gases (such as silane $SiH_4$ and propane $C_3H_8$ for silicon carbide) are introduced into a heated reaction chamber that also includes a substrate surface upon which the source gases react to form the epitaxial layer. In order to help control the rate of the growth reaction, the source gases are typically introduced with a carrier gas, with the carrier gas forming the largest volume of the gas flow.

Chemical vapor deposition (CVD) growth processes for silicon carbide have been refined in terms of temperature profiles, gas velocities, gas concentrations, chemistry, and pressure. The selection of conditions used to produce particular epilayers is often a compromise among factors such as desired growth rate, reaction temperature, cycle time, gas volume, equipment cost, doping uniformity, and layer thicknesses.

In particular, and other factors being equal, uniform layer thicknesses tend to provide more consistent performance in semiconductor devices that are subsequently produced from the epitaxial layers. Alternatively, less uniform layers tend to degrade device performance, or even render the layers unsuitable for device manufacture.

In typical CVD processes, however, a phenomenon known as "depletion" occurs and is described as the loss of source gas concentration as the source and carrier gases pass through the reaction vessel. More particularly, in typical CVD systems, the source and carrier gases flow parallel to the substrate and the epitaxial growth surface. Because the source gases react to form the epitaxial layers, their concentration tends to be highest at the gas entry or "upstream" end of the reactor and lowest at the downstream end. In turn, because the concentration of source gases decreases during the travel of the source gases through the reactor, epitaxial layers tend to result that are thicker at the upstream end and thinner at the downstream end. As noted above, this lack of uniformity can be disadvantageous in many circumstances, and is particularly troublesome when thicker epitaxial layers are desired or necessary for certain devices or device structures.

In growth techniques for other semiconductor materials (such as silicon), the problem can be addressed by fairly straightforward techniques such as rotating the substrate (typically a wafer) upon which the epitaxial layer is being grown. Such techniques become much more complex and difficult, however, when carried out at the much higher temperatures required to grow epitaxial layers of silicon carbide. Typically, the susceptors used for silicon carbide growth processes must be formed from highly purified graphite with a high purity coating of silicon carbide. When moving parts are formed from such materials, they tend to be rather complex and prone to generate dust because of the abrasive characteristics of the silicon carbide. Thus, such mechanical and motion-related solutions to the depletion problem are generally unsatisfactory for silicon carbide because of the mechanical difficulties encountered and the impurities that must otherwise be controlled. Accordingly, a need exists for chemical vapor deposition techniques for the epitaxial growth of silicon carbide that produce more uniform epitaxial layers, and yet do so without introducing additional impurities or mechanical complexity to the process.

OBJECT AND SUMMARY OF THE INVENTION

Therefore, it is an object of the present invention to provide a method for obtaining more uniform epitaxial layers of silicon carbide. The invention meets this object with an improved chemical vapor deposition method that increases the uniformity of silicon carbide epitaxial layers and that is particularly useful for obtaining thicker epitaxial layers. The method comprises heating a reactor to a temperature at which silicon carbide source gases will form an epitaxial layer of silicon carbide on a substrate in the reactor; and then directing a flow of source and carrier gases through the heated reactor to form an epitaxial layer of silicon carbide on the substrate with the carrier gases comprising a blend of hydrogen and a second gas in which the second gas has a thermal conductivity that is less than the thermal conductivity of hydrogen so that the source gases deplete less as they pass through the reactor than they would if hydrogen is used as the sole carrier gas. In certain embodiments the second gas is also preferably chemically inert with respect to the chemical vapor deposition reaction.

In another aspect the invention comprises a silicon carbide epitaxial layer with a highly uniform thickness as evidenced by its standard deviation of thickness along its cross section.

The foregoing and other objects and advantages of the invention and the manner in which the same are accomplished will become clearer based on the following detailed description taken in conjunction with the accompanying drawings in which:

DETAILED DESCRIPTION

Figure 1:
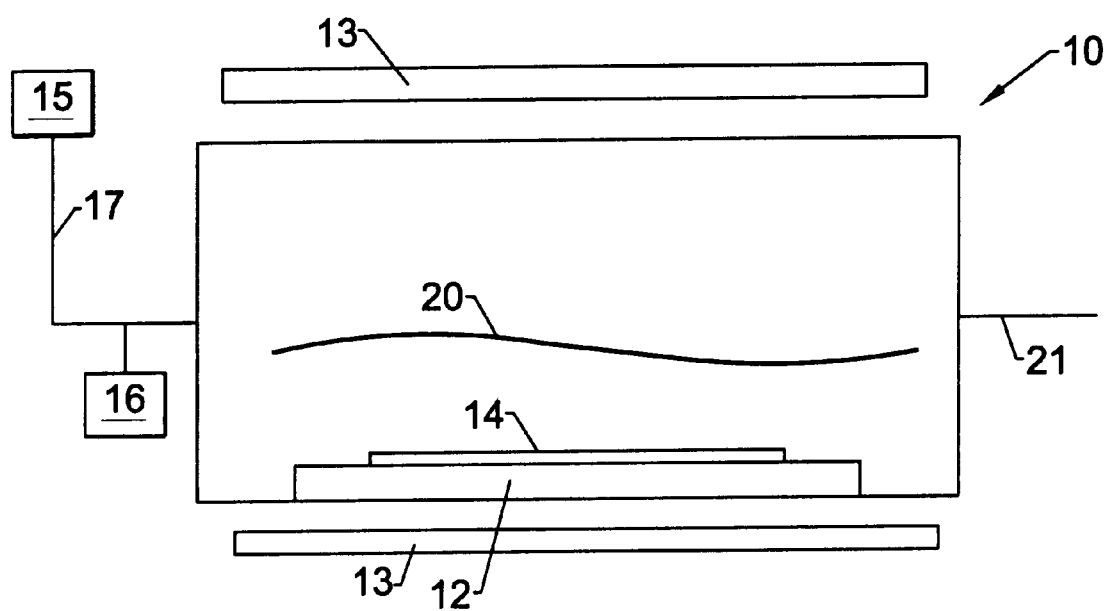
FIG. 1 is a schematic representation of a chemical vapor deposition system that is illustrative of those that can be used with the present invention.

The present invention is an improved chemical vapor deposition method that increases the uniformity of silicon carbide epitaxial layers and that is particularly useful for obtaining thicker epitaxial layers. In its method aspects, the invention comprises heating a reactor to a temperature in which silicon carbide source gases will form an epitaxial layer of silicon carbide on a substrate in the reactor; and thereafter directing a flow of source and carrier gases through the heated reactor to form an epitaxial layer of silicon carbide on the substrate with the carrier gases comprising a blend of hydrogen and a second gas in which the second gas has a thermal conductivity that is less than the thermal conductivity of hydrogen so that the source gases deplete less as they pass through the reactor than they would if hydrogen is used as the sole carrier gas. In certain embodiments, the second gas is preferably chemically inert with respect to the chemical vapor deposition reaction.

In preferred embodiments, the second carrier gas comprises argon. Argon has a number of advantages with respect to the present invention. In particular, argon has a significantly lower thermal conductivity than does hydrogen. The presence of argon thus moderates the thermal conductivity of the carrier gas which in turn moderates the rate at which the source gases deplete as they move through the reactor.

As another advantage, argon is a "noble" gas meaning that it tends to avoid reacting with other elements or compounds under almost any conditions. Thus, argon avoids any undesired effect on the epitaxial growth substrate, on the epitaxial layer being grown, or on the other gases in the system. It will be understood, however, that the second carrier gas is not limited to argon, but can be functionally selected to (1) moderate the thermal conductivity of the carrier gas and (2) avoid undesired reactions with the source gases, the substrate, or the epitaxial layer.

In preferred embodiments, the carrier gases are blended with a greater amount of hydrogen and a lesser amount of the second carrier gas. In most preferred embodiments, where the blend is formed of hydrogen and argon, the blend is preferably at least 75% by volume flow of hydrogen and most preferably up to about 90% by volume flow of hydrogen. Additionally, the blend is not necessarily limited to hydrogen and the gas with the lower thermal conductivity. If desired, another gas can be present (such as helium) provided that the overall blend meets the functional qualifications set forth above.

It will be understood that the volumes as described herein refer to flow volume on a per minute basis, which is a typical method of measuring the amounts of gases used in chemical vapor deposition systems.

In heating the reactor, the temperature should be high enough for the epitaxial growth of silicon carbide, but lower than the temperature at which the hydrogen carrier gas will tend to etch the silicon carbide. Preferably the system temperature is maintained at less than about 1800° C. and most preferably between about 1500° and 1650° C. At temperatures above about 1800° C., different types of reactions tend to take place; see e.g., Kordina et al., *Growth of SiC by "Hot-Wall" CVD and HTCVD*, Phys. Stat. 501(B) 202, 321 (1997).

The invention has been found to be particularly useful when the source and carrier gases are directed over a silicon carbide substrate, and most preferably one selected from the group consisting of the 4H and 6H polytypes, and through the reactor in a direction parallel to the epitaxial growth surface.

FIG. 1 is a schematic diagram of a reactor system that is exemplary of those useful with the present invention. The basic structure and arrangement of such a chemical vapor deposition system is generally well known to those of ordinary skill in this art and can be used by those of ordinary skill in this art to practice the invention without undue experimentation.

In FIG. 1 the overall CVD system is broadly designated at 10. The system includes a reactor chamber 11 which contains a susceptor 12. The susceptor 12 is typically heated by an inductive technique (such as radio frequency) using the electrodes 13 on the exterior of the reactor 11. A substrate 14 rests on the susceptor 12 so that as the radiation from the electrodes 13 heats the susceptor 12, the susceptor heats the substrate 13.

The system includes a supply of source gases and carrier gases schematically diagramed at 15 and 16, respectively. These are directed to the reactor 11 through an appropriate series of passageways or tubes generally designated at 17 and flow through the reactor as indicated by the curved line 20. It will be understood that the line 20 is simply for illustrative and schematic purposes and is not otherwise representative of the exact flow pattern of gases in a chemical vapor deposition system. The gases then exit through a similar set of tubes or passageways 21 at the downstream end of the reactor 11.

A number of comparative examples demonstrate the advantages of the present invention and are summarized in Table 1 and FIGS. 2–5. All of the data was collected from experiments conducted at Cree Research, Inc. in Durham, N.C., the assignee of the present invention. As set forth therein, epitaxial layers of silicon carbide were grown on silicon carbide substrates using either prior techniques (i.e., hydrogen alone as the carrier gas) or the present invention (a blend of hydrogen and argon as the carrier gas). In each case, the source gases were silane and propane provided at a significantly smaller flow rate than the carrier gas.

TABLE 1

| Example | Average thickness (μm) | Standard deviation (∞m) | standard dev/ mean (%) | Carrier gas (1/min) |
|---|---|---|---|---|
| 1 | 28.5 | 1.61 | 5.66 | 44 $H_2$ |
| 2 | 58.7 | 1.33 | 2.26 | 60 $H_2$ |
| 3 | 26.0 | 0.61 | 2.34 | 40 $H_2$ + 4 Ar |
| 4 | 28.8 | 0 | 0 | 60 $H_2$ + 1 Ar |
| 5 | 27.5 | 0 | 0 | 60 $H_2$ + 2 Ar |
| 6 | 23.8 | 0 | 0 | 60 $H_2$ + 4 Ar |

Figure 5:
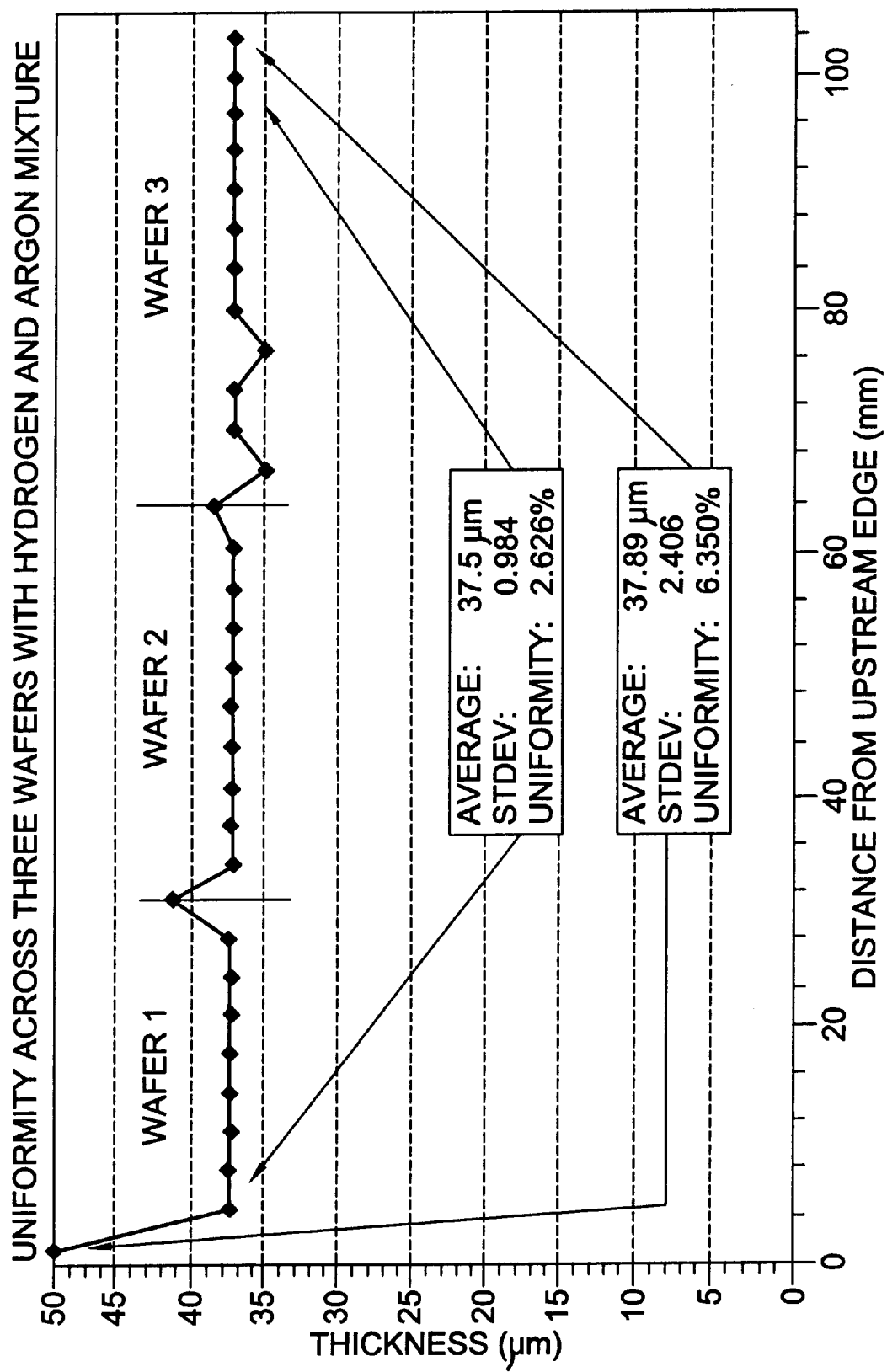
FIG. 5 is a plot of wafer thicknesses versus distance from the upstream edge for the respective epitaxial layers grown on three adjacent wafers in a single reactor using the method of the present invention.
Figure 6:
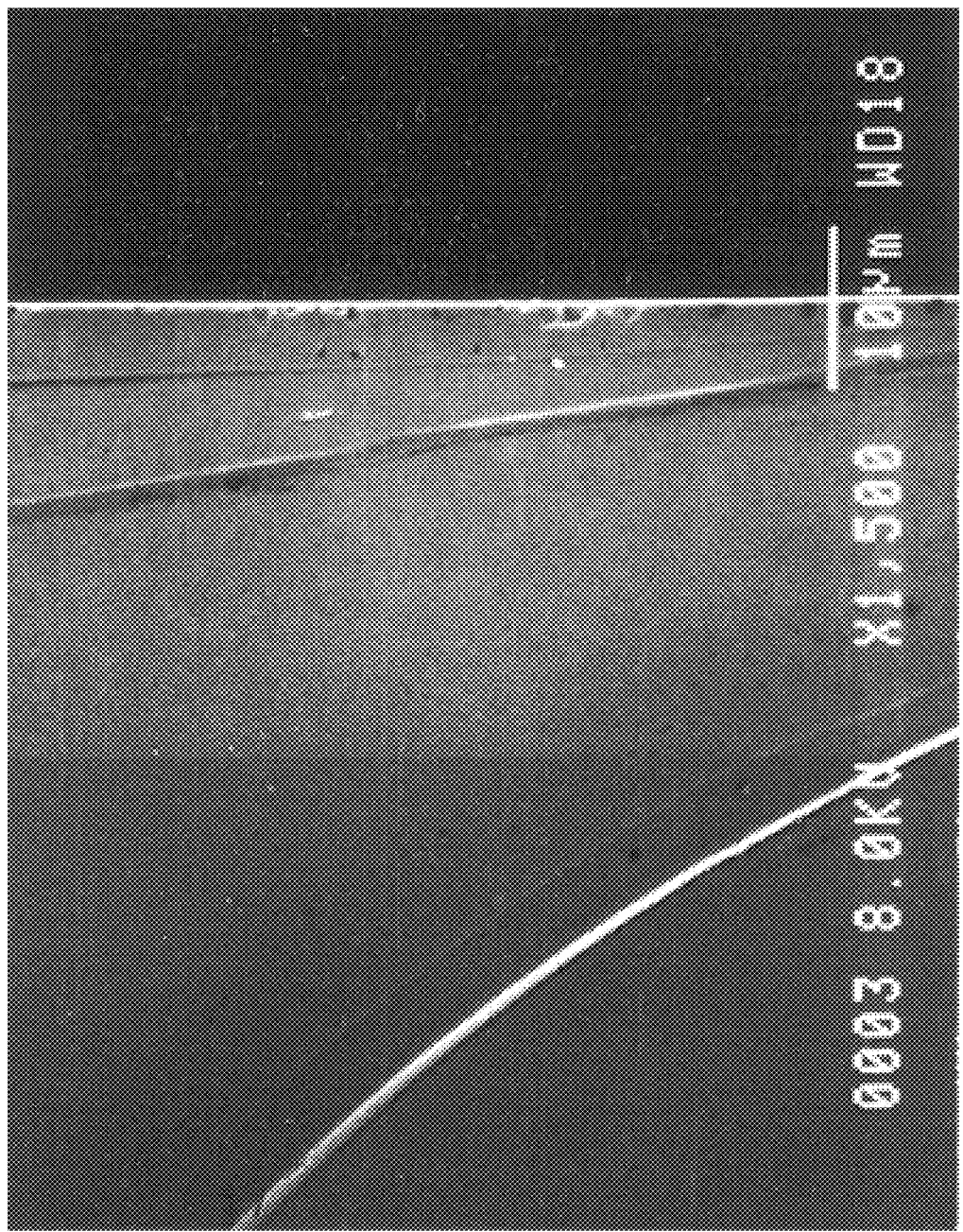
FIG. 6 is a photograph taken with a scanning electron microscope ("SEM") of a cleaved cross-section of a substrate with an epitaxial layer grown according to the present invention.

The samples were measured using a Scanning Electron Microscope (SEM). The wafers were cleaved along the flow direction. They were then placed on the edge in the SEM. Since the layers were much lower doped than the substrate, contrast between the layer and the substrate was observed (FIG. 6). The layer thickness could thus be measured. As shown in FIGS. 2–5, by measuring the thickness in this way on several equidistant points along the cleaved edge, the thickness uniformity could be calculated. There are other techniques for measuring the thickness uniformity, which are not described herein. Removing the data points associated with the epi-crown (e.g., 2 mm closest to the wafer perimeter) is nevertheless common to all techniques in order to reproduce the uniformities shown in Table 1.

The thicknesses of the resulting epitaxial layers were measured at between 10 and 15 positions across the diameter of each resulting wafer. The average (i.e., statistical mean) thickness, the standard deviation, and the percentage deviation (standard deviation expressed as a percentage of the average thickness.) were then measured for each wafer. In order to prevent edge effects from mischaracterizing the results from the prior art or the invention, either one or two data points were removed from the population prior to the calculation. It will be understood that these data points were not removed at random to artificially enhance the results. Instead, data points at one or both of the wafer edges were removed in order to avoid including the "epi-crown" that is generally commonly found in epitaxial growth and that is generally unrelated to the depletion effect.

Figure 2:
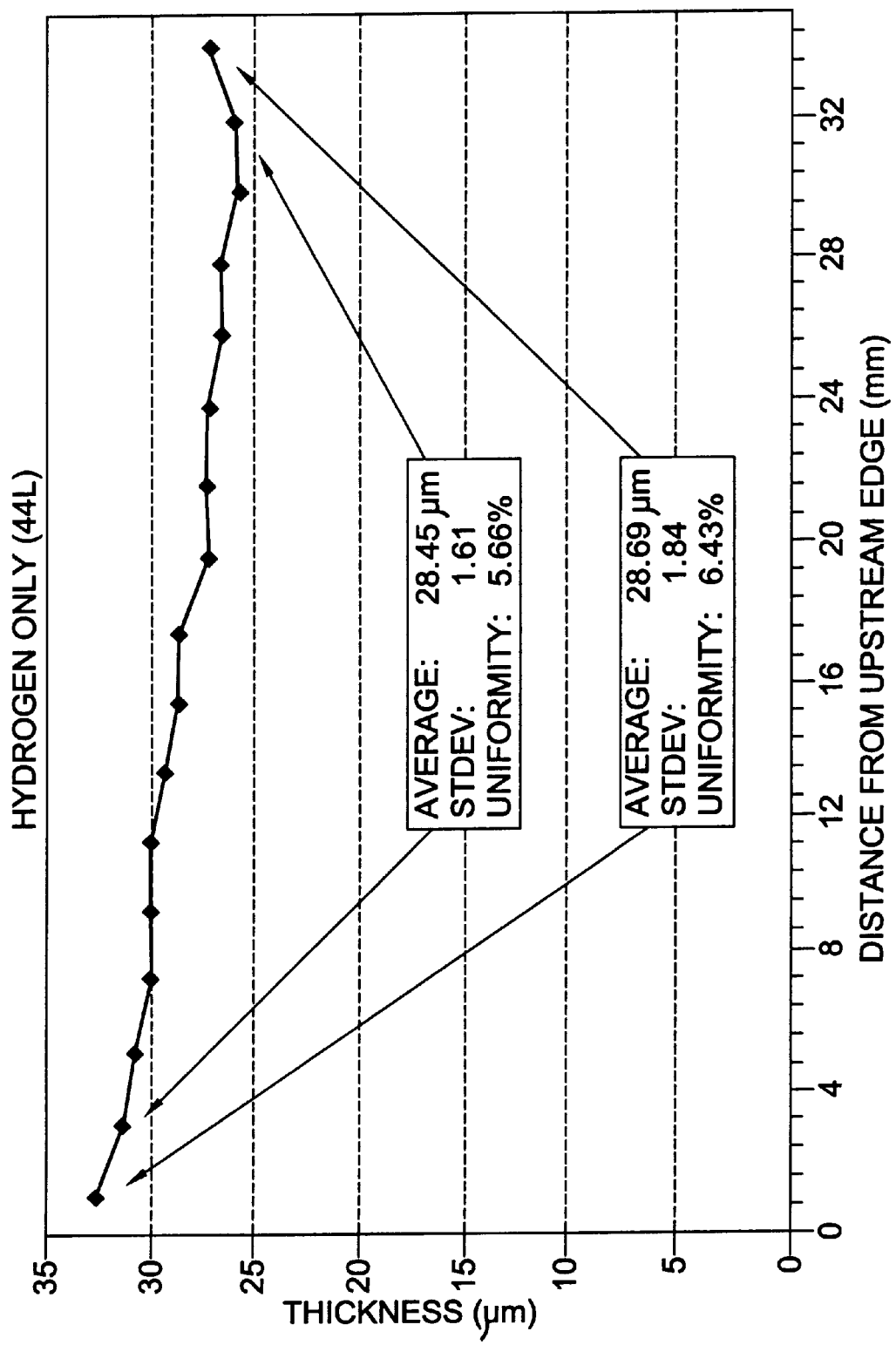
FIGS. 2 and 3 are plots of wafer thickness versus distance from the upstream edge of epitaxial layers grown using prior art techniques.
Figure 3:
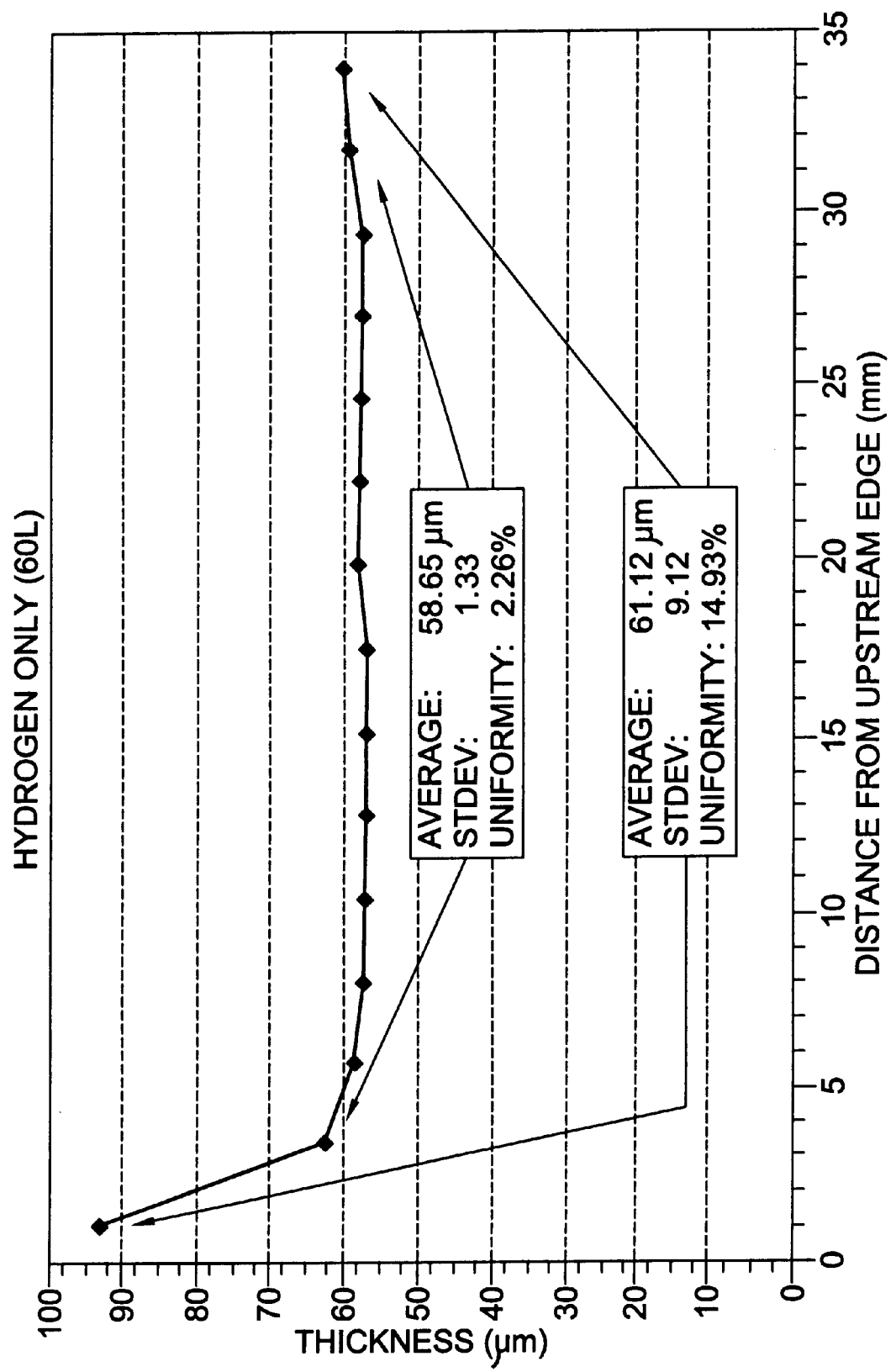
Figure 4:
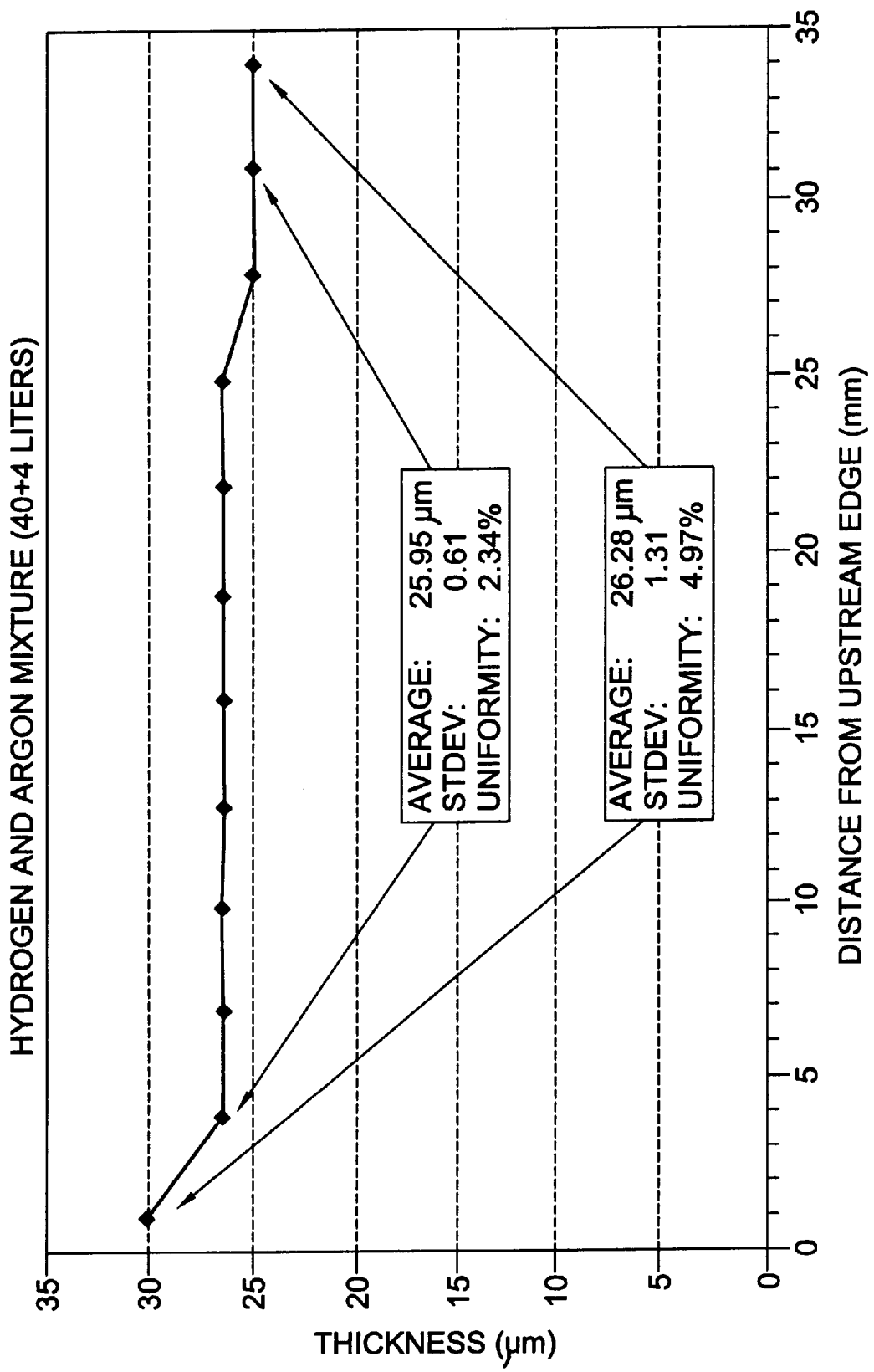
FIG. 4 is a plot of wafer thickness versus distance from the upstream edge of an epitaxial layer grown using the method of the present invention.

As FIGS. 2, 3 and 4 demonstrate, the invention provides a dramatic improvement in the thickness uniformity for epitaxial layers. For example, using hydrogen alone as the carrier gas (FIGS. 2 and 3), the percentage deviation was 5.66% and 2.66% with data points measured on the epi crown removed. Using the invention, however, a percentage deviation of 2.34% was obtained for the same hydrogen-alone flow rate that gave the 5.66% deviation. The beneficial effect of the invention is even more evident when used with several wafers that are placed one behind another in the flow direction of the reactor. FIG. 5 illustrates these results and shows that the uniformity for all three wafers is favorably comparable with the uniformity of single wafers grown under the same conditions.

FIG. 2 illustrates the edge thickness variations using a prior art technique of hydrogen alone as the carrier gas at a flow rate of 44 liters/minute. FIG. 3 illustrates the edge thickness variations using of hydrogen alone at a flow rate of 60 liters/minute. In contrast, FIGS. 4 and 5 illustrate the improved results using the present invention. In particular, FIG. 5 illustrates the advantages of the invention when it is used in a multiple-wafer growth system. As FIG. 5 illustrates, the deviation across three wafers using the method of the invention is favorably similar to the deviation across one wafer (e.g. FIG. 3) using the prior art techniques.

Thus, in another aspect, the invention comprises a silicon carbide epitaxial layer with a standard deviation of thickness along its cross section of less than 3% when the data points measured on the epi-crown are dropped from the population. In more preferred embodiments, the standard deviation is less than 2% when the two data points from the epicrown are dropped from the population, and in a most preferred embodiment, the standard deviation is less than 1%.

It will be understood, of course, that the term epitaxial layer implies the presence of a substrate, and in preferred embodiments the substrate is a single crystal silicon carbide substrate selected from the group consisting of 4H and 6H polytypes of silicon carbide.

As used herein, the terms "mean," "standard deviation," "sample," and "population," are used in their normal sense. These values and definitions are well understood within the field of statistics and thus their definition and manner of calculating them will not otherwise be discussed in detail.

A blend of hydrogen and argon is preferred over pure argon as a carrier gas because pure argon is generally relatively hard to purify, is somewhat expensive, and on an empirically observed basis, it seems to harm material quality, while hydrogen seems to purify the growing material. Stated differently, hydrogen as a carrier gas appears to have some scavenging properties. Because of its low thermal conductivity, a carrier gas of pure argon would also tend to retard growth rates beyond a point that is generally desirable.

The selected proportion of the mix of argon and hydrogen can depend on a number of factors. These factors are, however, relatively well known in the art, and thus once the concept of the invention is understood, the blend can be selected by those of ordinary skill in the art without undue experimentation. As examples (rather than limitations), however, the amount of argon blended with the hydrogen will depend on items such as the length of the hot zone, the cost of argon, total gas flow, gas purity, and zone temperature. In particular, in most cases, the longer (in distance) the hot zone extends and the higher the expected or required temperature, the more argon is desirably used to moderate the depletion effects.

Additionally, the price of argon (as noted above, it is expensive) is a practical, although not theoretical, limitation on how much argon is most desirably used.

A third factor is total gas flow. A lower total gas flow is generally advantageous in a CVD system because it moderates the load on the pumping system, requires less energy and reduces turbulence, and avoids cooling the susceptor.

The purity of argon represents another factor. Because argon cannot be purified as well as hydrogen, the amount used is preferably minimized to correspondingly minimize any associated impurities. Fortunately, because argon's thermal conductivity is approximately one-tenth that of hydrogen's, a relatively small fraction of argon is sufficient to carry out the present invention.

All of the problems associated with uniform thickness control during chemical vapor deposition are exacerbated when thicker layers are being grown. Thus, the invention provides an even more noticeable improvement for growing thicker layers. Furthermore, because the invention merely requires blending gases, it avoids the moving parts and mechanical complexity of some other systems for reducing depletion.

In the drawings and specification, there have been disclosed typical embodiments of the invention, and, although specific terms have been employed, they have been used in That which is claimed is:

1. A method of forming epitaxial layers of silicon carbide on an appropriate substrate by chemical vapor deposition, the method comprising:

blending silicon carbide source gases are with a first carrier gas; directing the source gases into a reactor that contains a substrate over which the carrier and source gases flow over the substrates in an upstream to downstream orientation parallel to the epitaxial growth surface of the substrate;

heating the reactor to a temperature at which the source gases will react to form an epitaxial layer of silicon carbide on the substrates in the reactor; and while blending a second carrier gas with the first carrier gas, and in which the second carrier gas has a thermal conductivity that is less than the thermal conductivity of the first carrier gas, and wherein the second carrier gas is present in an amount that moderates the temperature sufficiently to reduce or eliminate source gas depletion during the growth of an epitaxial layers of silicon carbide on the substrate, but less than an amount that would reduce the temperature sufficiently to prevent the source gases from reacting to form the epitaxial layer.

2. A chemical vapor deposition method according to claim 1 wherein the second gas is chemically inert with respect to the chemical vapor deposition reaction.

3. A chemical vapor deposition method according to claim 1 wherein the second carrier gas comprises argon.

4. A chemical vapor deposition method according to claim 1 wherein the first carrier gas is selected from the group consisting of helium and blends of helium and hydrogen.

5. A chemical vapor deposition method according to claim 1 wherein the step of blending the carrier gases comprises blending a greater amount of hydrogen with a lesser amount of the second carrier gas.

6. A chemical vapor deposition method according to claim 1 wherein the source gases comprise a silicon-containing compound and a carbon-containing compound.

7. A chemical vapor deposition method according to claim 6 wherein the source gases comprise silane and propane.

8. A chemical vapor deposition method according to claim 7 comprising heating the system to a temperature less than about 1800° C.

9. A chemical vapor deposition method according to claim 7 comprising heating the system to a temperature of between about 1500° and 1650° C.

10. A chemical vapor deposition method according to claim 1 comprising directing the gas flow through the reactor in a direction parallel to the epitaxial growth surface.

11. A chemical vapor deposition method according to claim 1 comprising directing the source and carrier gases over a silicon carbide substrate selected from the group consisting of the 4H and 6H polytypes.

12. A chemical vapor deposition method according to claim 1 wherein the second carrier gas is chemically inert with respect to the chemical vapor deposition reaction and the silicon carbide.

13. In a method of forming epitaxial layers of silicon carbide on appropriate substrates by chemical vapor deposition, and in which silane and propane source gases are blended with hydrogen as the carrier gas and directed into a reactor that is heated to a temperature of between about 1500 and 1650° C. at which the silane and propane will react to form an epitaxial layer of silicon carbide on a substrate, the improvement comprising:

blending argon with the hydrogen carrier gas, and wherein the argon is present in an amount that moderates the temperature sufficiently to reduce or eliminate source gas depletion during cvd growth, but less than an amount that keeps the source gases from reacting to form the epitaxial layer.

14. A chemical vapor deposition method according to claim 13 wherein the blend of hydrogen and argon comprises more than 75 percent by volume flow of hydrogen.

15. A chemical vapor deposition method according to claim 14 wherein the blend comprises about 90 percent by volume flow of hydrogen.

16. A chemical vapor deposition method according to claim 13 comprising directing the gas flow through the reactor in a direction parallel to the epitaxial growth surface.

17. A chemical vapor deposition method according to claim 13 comprising directing the source and carrier gases over a silicon carbide substrate selected from the group consisting of the 4H and 6H polytypes.

18. In a method of forming epitaxial layers of silicon carbide on a plurality of appropriate substrates by chemical vapor deposition by:

blending silicon carbide source gases are with a first carrier gas;

directing the source gases into a reactor that contains a plurality of substrates linearly arranged along the gas flow path in the reactor so that the carrier and source gases flow over the substrates in an upstream to downstream orientation parallel to the epitaxial growth surface; and heating the reactor to a temperature at which the source gases will react to form an epitaxial layer of silicon carbide on the substrates in the reactor;

the improvement that comprises:

blending a second carrier gas with the first carrier gas, and in which the second carrier gas has a thermal conductivity that is less than the thermal conductivity of the first carrier gas, and wherein the second carrier gas is present in an amount that moderates the temperature sufficiently to reduce or eliminate source gas depletion during the growth of epitaxial layers of silicon carbide on the substrates, but less than an amount that would reduce the temperature sufficiently to prevent the source gases from reacting to form the epitaxial layer.

19. A chemical vapor deposition method according to claim 18 wherein the second carrier gas is chemically inert with respect to the chemical vapor deposition reaction and the silicon carbide.

20. A chemical vapor deposition method according to claim 18 wherein the first carrier gas comprises hydrogen and the second carrier gas comprises argon.

21. A chemical vapor deposition method according to claim 18 wherein the step of blending the carrier gases comprises blending a greater amount of the first carrier gas with a lesser amount of the second carrier gas.

22. A chemical vapor deposition method according to claim 18 wherein the source gases comprise a silicon-containing compound and a carbon-containing compound.

23. A chemical vapor deposition method according to claim 22 wherein source gases comprise silane and propane.

24. A chemical vapor deposition method according to claim 23 comprising heating the system to a temperature less than about 1800° C.

25. A chemical vapor deposition method according to claim 23 wherein the reactor is heated to a temperature of between about 1500° and 1650° C.

26. A chemical vapor deposition method according to claim 18 comprising directing the gas flow through the reactor in a direction parallel to the epitaxial growth surface.

27. A chemical vapor deposition method according to claim 18 comprising directing the source and carrier gases over a silicon carbide substrate selected from the group consisting of the 4H and 6H polytypes.

* * * * *

UNITED STATES PATENT AND TRADEMARK OFFICE
CERTIFICATE OF CORRECTION

PATENT NO. : 6,063,186
DATED : May 16, 2000
INVENTOR(S) : Irvine et al.

It is certified that error appears in the above-identified patent and that said Letters Patent is hereby corrected as shown below:

Column 1,
Please insert just prior to the first paragraph the following:

-- This invention was developed with the support of the USAF under Contract No. F33615-95-C-5426. The government may have certain rights in this invention. --

Signed and Sealed this

Fifteenth Day of July, 2003

JAMES E. ROGAN
*Director of the United States Patent and Trademark Office*